(12) United States Patent
Lee

(10) Patent No.: US 7,820,499 B2
(45) Date of Patent: Oct. 26, 2010

(54) METHOD FOR MANUFACTURING A NONVOLATILE MEMORY DEVICE

(75) Inventor: In No Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 122 days.

(21) Appl. No.: 12/163,697

(22) Filed: Jun. 27, 2008

(65) Prior Publication Data

US 2009/0191697 A1    Jul. 30, 2009

(30) Foreign Application Priority Data

Jan. 28, 2008    (KR)  ................ 10-2008-0008498

(51) Int. Cl.
*H01L 21/336*    (2006.01)
*H01L 21/8234*    (2006.01)

(52) U.S. Cl. ............... 438/197; 257/E21.646; 257/E21.662; 257/E21.663; 257/E21.665

(58) Field of Classification Search .......... 438/197; 257/E21.646, E21.662, E21.663, E21.665, 257/E21.679, E27.098
See application file for complete search history.

(56) References Cited

U.S. PATENT DOCUMENTS 6,355,566 B1 * 3/2002 Howard et al. ............ 438/697
6,867,098 B2 * 3/2005 Park et al. ................. 438/257
7,541,255 B2 * 6/2009 Kim et al. ................. 438/401

FOREIGN PATENT DOCUMENTS

| KR | 1020020052459 A | 7/2002 |
| KR | 1020060076497 A | 7/2006 |
| KR | 1020060088637 A | 8/2006 |

* cited by examiner

*Primary Examiner*—Davienne Monbleau
*Assistant Examiner*—Monica D Harrison
(74) *Attorney, Agent, or Firm*—Townsend and Townsend and Crew LLP

(57) ABSTRACT

In a method for manufacturing a nonvolatile memory device, an etch mask layer formed on a dielectric layer to define contact holes in the dielectric layer is slope-etched to form an etch mask pattern having an opening wider at the upper end thereof than the lower end thereof. Thus, the contact holes are defined in the dielectric layer to have a finer size than the upper end of the opening of the etch mask pattern. The method for manufacturing a nonvolatile memory device includes forming an etch mask pattern on a dielectric layer such that a width of a lower end of each opening defined in the etch mask pattern is less than a width of an upper end thereof; and defining contact holes by removing portions of the dielectric layer using the etch mask pattern.

15 Claims, 8 Drawing Sheets

METHOD FOR MANUFACTURING A NONVOLATILE MEMORY DEVICE

CROSS-REFERENCE TO RELATED APPLICATIONS

This application claims priority from Korean Patent Application No. 10-2008-0008498, filed on Jan. 28, 2008, the contents of which are incorporated herein by reference in its entirety.

BACKGROUND OF THE INVENTION

The present invention relates to a method for manufacturing a nonvolatile memory device, and more particularly, to a method for manufacturing a nonvolatile memory device which is used to manufacture a NAND flash memory device.

In general, semiconductor memory devices are categorized into volatile memory devices and nonvolatile memory devices. In volatile memory devices, even though the input and output of data can be quickly implemented as in a dynamic random access memory (DRAM) and a static random access memory (SRAM), if a power supply fails or is turned off, input data is lost. In nonvolatile memory devices, even when a power supply fails or is turned off, stored data is retained continuously.

A flash memory device is a highly integrated nonvolatile memory device which has been developed by combining the advantages of an erasable programmable read only memory (EPROM) and an electrically erasable programmable read only memory (EEPROM). Programming refers to the operation of writing data into memory cells, and erasing refers to the operation of erasing the data written in memory cells.

A NAND flash memory device operates using an FN (Fowler-Nordheim) tunneling phenomenon such that programming is implemented by introducing electrons into floating gates, and erasing is implemented by discharging electrons from the floating gates. The NAND flash memory device is configured to include cell strings in each of which a plurality of memory cell transistors are connected in series. In the cell string, select transistors including a drain select transistor and a source select transistor are respectively connected in series to both ends of the memory cell transistors connected in series. The NAND flash memory device has advantages in that, since the amount of current flowing in the cell string is small, power consumption thereof is less than that of a NOR flash memory device. Also, because the high integration of the NAND flash memory device can be easily accomplished when compared to the NOR flash memory device, the NAND flash memory device is appropriate for the manufacture of a memory device having a large capacity. Due to these facts, recently, the NAND flash memory device has been widely used.

Usually, in the manufacture of the NAND flash memory device, in order to improve efficiency, the select transistors are formed in a process for forming the memory cell transistors. In the memory cell transistors, floating gates and control gates have to be insulated from each other, but, in the select transistors, floating gates and control gates have to be electrically connected with each other. After forming a dielectric layer on the floating gates of the memory cell transistors and the select transistors for the purpose of insulation, a contact hole defining process for removing portions of the dielectric layer formed in the select transistors is conducted. Thereafter, by forming the control gates of the memory cell transistors and select transistors, the floating gates and the control gates of the memory cell transistors are insulated from each other due to the presence of the dielectric layer, and the floating gates and the control gates of the select transistors are electrically connected with each other due to the presence of contact holes.

As the NAND flash memory device is rapidly scaled down and is highly integrated, the size of the contact holes defined in the dielectric layer gradually decreases. Thus, the mask pattern for defining the contact holes in the dielectric layer must be formed to have a fine size. However, due to a limit in the precision of exposure equipment, limitations necessarily exist in forming the mask pattern to have a fine size. Therefore, difficulties are caused in the process for finely defining the contact holes in the dielectric layer.

SUMMARY OF THE INVENTION

Embodiments of the present invention are directed to a method for manufacturing a nonvolatile memory device, in which the etch mask layer formed on a dielectric layer to define contact holes in the dielectric layer is slope-etched to form an etch mask pattern having an opening wider at an upper end thereof than a lower end thereof so that contact holes can be defined in the dielectric layer to have a finer size than the upper end of the opening of the etch mask pattern.

In one aspect, a method for manufacturing a nonvolatile memory device comprises the steps of forming a tunnel insulation layer on a semiconductor substrate including isolation regions and active regions; forming a conductive layer for gates on the tunnel insulation layer; forming a dielectric layer on the conductive layer for gates; forming an etch mask pattern on the dielectric layer such that a width of a lower end of each opening defined in the etch mask pattern is less than a width of an upper end thereof; and defining contact holes by removing portions of the dielectric layer using the etch mask pattern.

The step of forming the etch mask pattern comprises the steps of forming an etch mask layer comprising multiple layers on the dielectric layer; and patterning the etch mask layer such that any one of the layers included in the etch mask layer is slope-etched, thereby forming the etch mask pattern. The step of forming the etch mask pattern comprises the steps of forming a passivation layer on the dielectric layer; forming a BARC (bottom anti-reflection coating) layer on the passivation layer; forming a mask pattern on the BARC layer; slope-etching the BARC layer using the mask pattern, thereby patterning the BARC layer; and patterning the passivation layer using the patterned BARC layer. Slope etching is conducted such that a byproduct produced while etching the BARC layer remains in peripheries of respective openings defined in the patterned BARC layer. The slope etching is conducted as inductively coupled plasma (ICP) etching. The slope etching uses HBr gas an etchant gas. The slope etching is conducted with a transformer coupled plasma (TCP) power of 300 W to 1,000 W and a bias power of 200 W to 400 W at a temperature of 30° C. to 50° C. The contact holes in the dielectric layer are defined through an ICP etching process. The contact holes in the dielectric layer are defined using $CF_4$ gas as an etchant gas. After the step of defining the contact holes in the dielectric layer, the method further comprises the step of removing exposed portions of the conductive layer for gates by a partial thickness. The exposed portions of the conductive layer for gates are removed through an ICP etching process. The exposed portions of the conductive layer for gates are removed using $CHF_3$ gas. The exposed portions of the conductive layer for gates are removed with a TCP power of 300 W to 1,000 W and a bias power of 100 W to 300 W at a temperature of 30° C. to 50° C. The step of patterning the passivation layer is implemented through an etching process having an etching selectivity ratio of 10:1 to 100:1 with respect to the dielectric layer. The step of patterning the passivation layer is implemented through an ICP etching process. The step of patterning the passivation layer is implemented using HBr gas and $O_2$ gas. The step of patterning the passivation layer is implemented with a TCP power of 300 W to 1,000 W and a bias power of 200 W to 400 W at a temperature of 30° C. to 50° C.

DESCRIPTION OF SPECIFIC EMBODIMENT

Reference will now be made in detail to a specific embodiment of the invention, an example of which is illustrated in the attached drawings.

It is to be noted that the present invention must not be construed as being limited to the following embodiment and can be realized in a variety of ways, and the scope of the present invention must not be limitedly understood by the following embodiment. Also, those persons who have ordinary knowledge in the art will appreciate that various embodiments are possible without departing from the technical concept of the present invention. The embodiment is provided to make the disclosure of the present invention complete and to allow those persons having ordinary knowledge in the art to better understand the scope of the present invention. The scope of the present invention must be understood by the accompanying claims.

Figure 1:
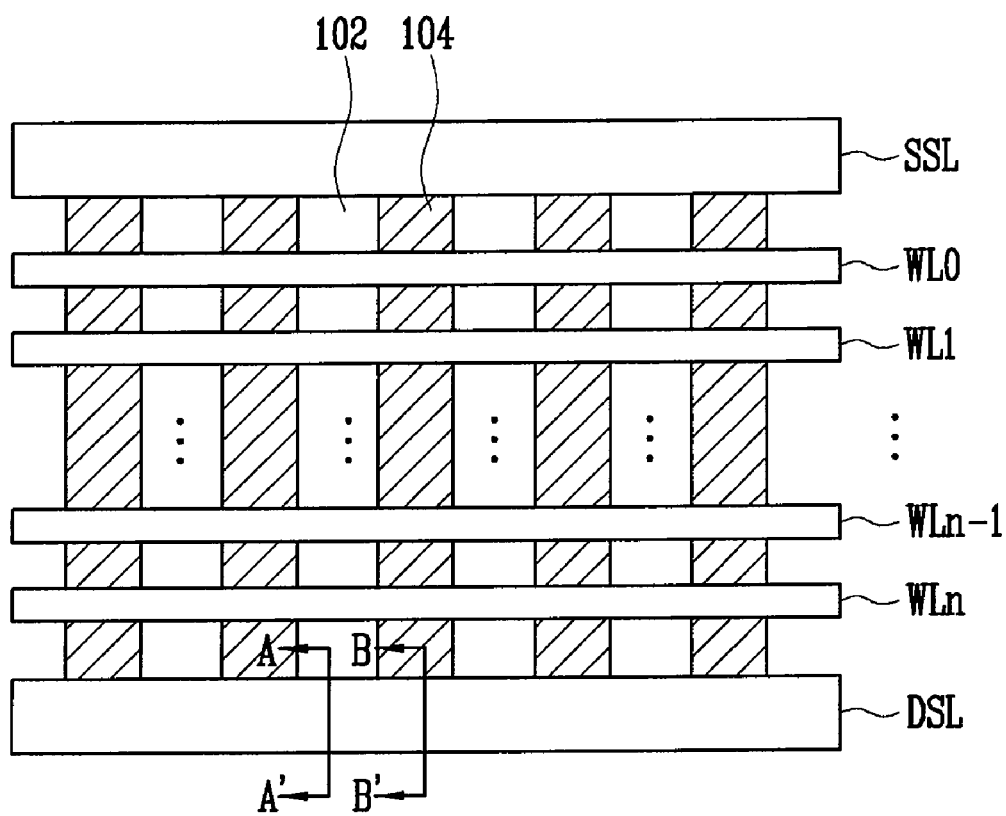
FIG. 1 is a layout diagram of a nonvolatile memory device illustrating a method for manufacturing a nonvolatile memory device in accordance with an embodiment of the present invention.

FIG. 1 is a layout diagram of a nonvolatile memory device illustrating a method for manufacturing a nonvolatile memory device in accordance with an embodiment of the present invention.

Referring to FIG. 1, an isolation layer 104 is formed in the isolation regions of a semiconductor substrate which is to be formed as a NAND flash memory device as a kind of nonvolatile memory device. A plurality of parallel active regions 102 are delimited. In a direction that intersects the active regions 102, select lines including a source select line SSL and a drain select line DSL and a plurality of word lines WL0 through WLn placed between the select lines are formed in parallel to one another. A plurality of memory cell transistors are formed in portions of the active regions 102 which intersect the respective word lines WL0 through WLn. A plurality of source select transistors are formed in portions of the active regions 102 which intersect the source select line SSL, and a plurality of drain select transistors are formed in portions of the active regions 102 which intersect the drain select line DSL. The method for manufacturing a nonvolatile memory device according to the present invention will be described in detail with reference to the sectional views of a nonvolatile memory device.

FIGS. 2A through 2G are sectional views illustrating the active region of a select line to describe the method for manufacturing a nonvolatile memory device according to the present invention, taken along line A-A' of FIG. 1. FIGS. 3A through 3G are sectional views illustrating the isolation region of the select line to describe the method for manufacturing a nonvolatile memory device according to the present invention, taken along line B-B' of FIG. 1.

Figure 2A:
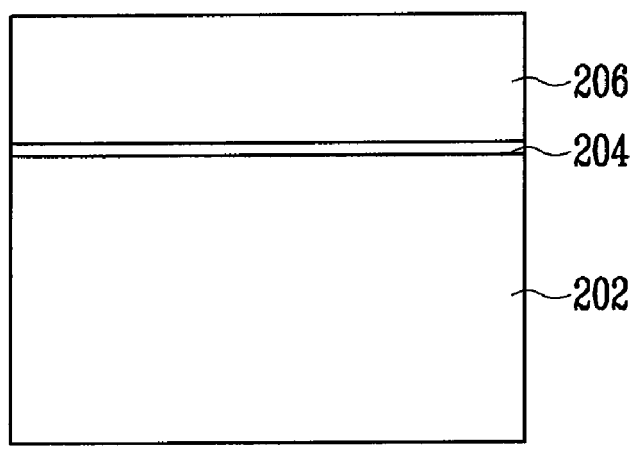
FIGS. 2A through 2G are sectional views illustrating the processes of the method according to the is present invention taken along line A-A' of FIG. 1.
Figure 3A:
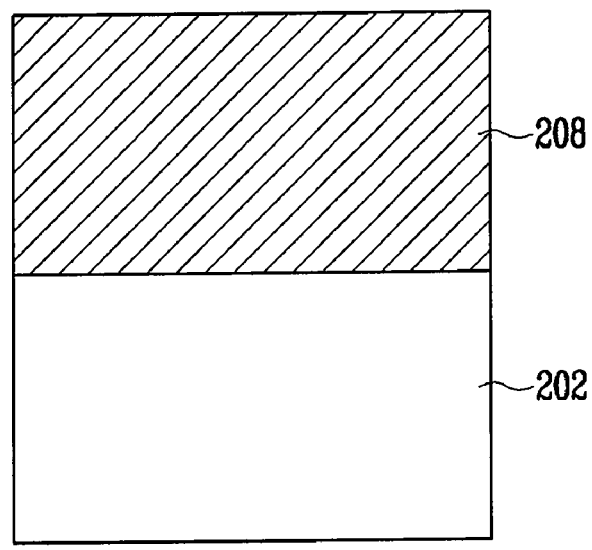
FIGS. 3A through 3G are sectional views illustrating the processes of the method according to the present invention taken along line B-B' of FIG. 1.

Referring to FIGS. 2A and 3A, a screen oxide layer (not shown) is formed on a semiconductor substrate 202 which is to be formed as a NAND flash memory device. A well ion implantation process and a threshold voltage ion implantation process are conducted for the semiconductor substrate 202. The well ion implantation process is conducted to form well areas in the semiconductor substrate 202, and the threshold voltage ion implantation process is conducted to adjust the threshold voltage of semiconductor elements such as transistors. The screen oxide layer prevents the surface of the semiconductor substrate 202 from being damaged during the well ion implantation process or the threshold voltage ion implantation process. Well areas (not shown) are formed in the semiconductor substrate 202. The well areas can be formed to have a triple-layered structure.

After removing the screen oxide layer, a tunnel insulation layer 204 is formed on the semiconductor substrate 202. The tunnel insulation layer 204 can pass electrons from the channels defined under the tunnel insulation layer 204 to the floating gates formed over the tunnel insulation layer 204 by an FN (Fowler-Nordheim) tunneling phenomenon. It is preferred that the tunnel insulation layer 204 be formed as an oxide layer.

A conductive layer 206 for gates is formed on the tunnel insulation layer 204. The conductive layer 206 for gates is formed to form a charge storing layer, for example, floating gates, in and from which the charges transferred from the channels defined under the tunnel insulation layer 204 are stored and the stored charges are discharged to channel junctions. It is preferred that the conductive layer 206 for gates be formed of polysilicon.

A mask pattern (not shown) is formed on the conductive layer 206 for gates such that the isolation regions of the semiconductor substrate 202 are exposed, that is, open. The portions of the conductive layer 206 for gates and the tunnel insulation layer 204, which are formed in the isolation regions of the semiconductor substrate 202, are removed using the mask pattern. By partially etching the semiconductor substrate 202, trenches are defined. By filling an insulation material, for example, an oxide layer, into the trenches, an isolation layer 208 is formed in the isolation regions of the semiconductor substrate 202. The isolation layer 208 is formed on the semiconductor substrate 202 along the plurality of isolation regions which are parallel to one another. By the isolation layer 208 which is formed in the isolation regions, active regions are delimited. While not shown in the drawings, in order to increase the area over which floating gates and control gates face each other, a process for decreasing the height of the isolation layer 208 can be conducted such that portions of the sidewalls of the conductive layer 206 for gates are partially exposed.

Figure 2B:
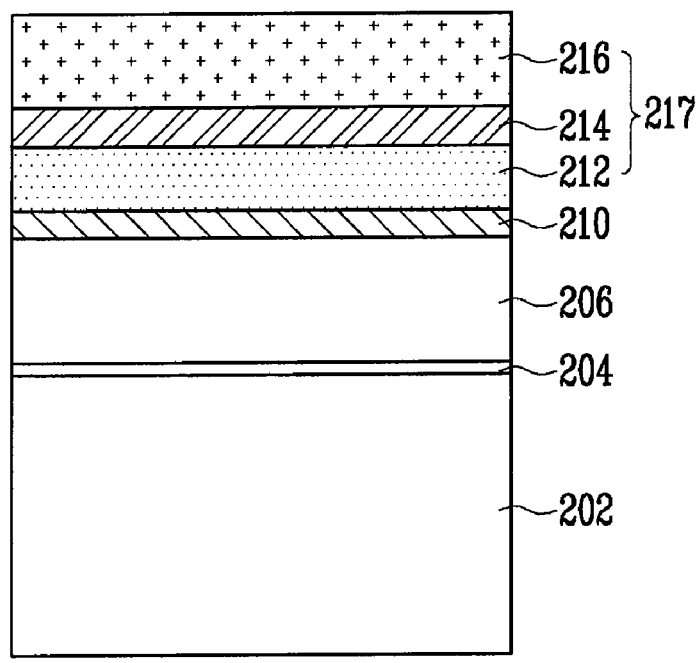
Figure 3B:
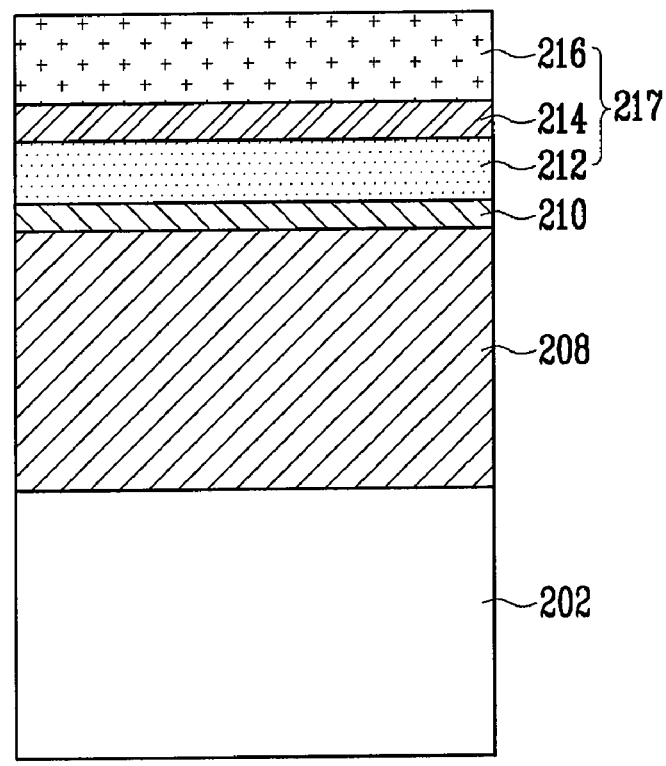

Referring to FIGS. 2B and 3B, a dielectric layer 210 is formed on the conductive layer 206 for gates which is formed in the active regions and on the isolation layer 208 which is formed in the isolation regions. The dielectric layer 210 insulates the floating gates and the control gates of the memory cell transistors from each other, which are formed in the active regions. The dielectric layer 210 may be formed to have an ONO (oxide/nitride/oxide) structure as the stack of an oxide layer, a nitride layer and an oxide layer.

An etch mask layer 217 is formed on the dielectric layer 210. The etch mask layer 217 can be formed as a stacked layer including a passivation layer 212, a bottom anti-reflection coating (BARC) layer 214, and a mask layer 216. The passivation layer 212 is formed to prevent the dielectric layer 210 from being damaged during a subsequent process for etching the dielectric layer 210. Preferably, the passivation layer 212 is formed with no time delay after forming the dielectric layer 210. The passivation layer 212 can be formed of a material which has a different etching selectivity from the dielectric layer 210. In particular, it is preferred that the passivation layer 212 be formed as a conductive layer for gates, for example, a polysilicon layer, to partially constitute the control gates formed on the dielectric layer 210.

Figure 2C:
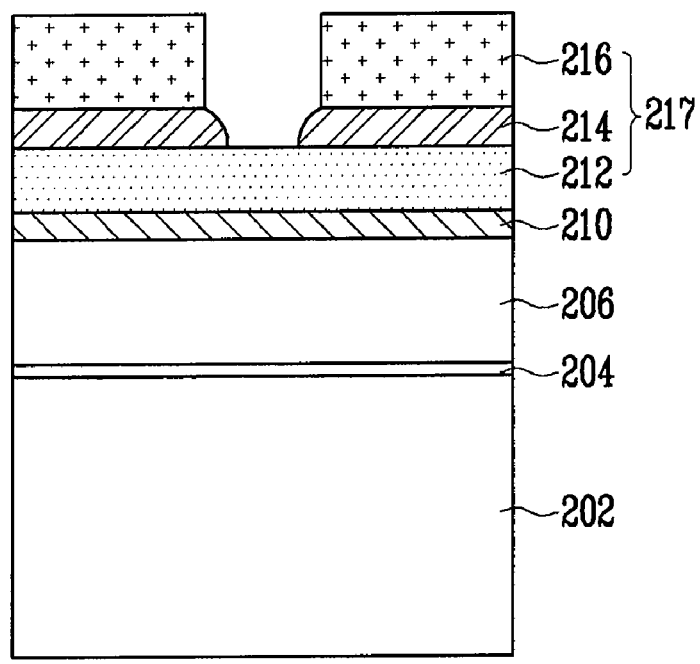
Figure 3C:
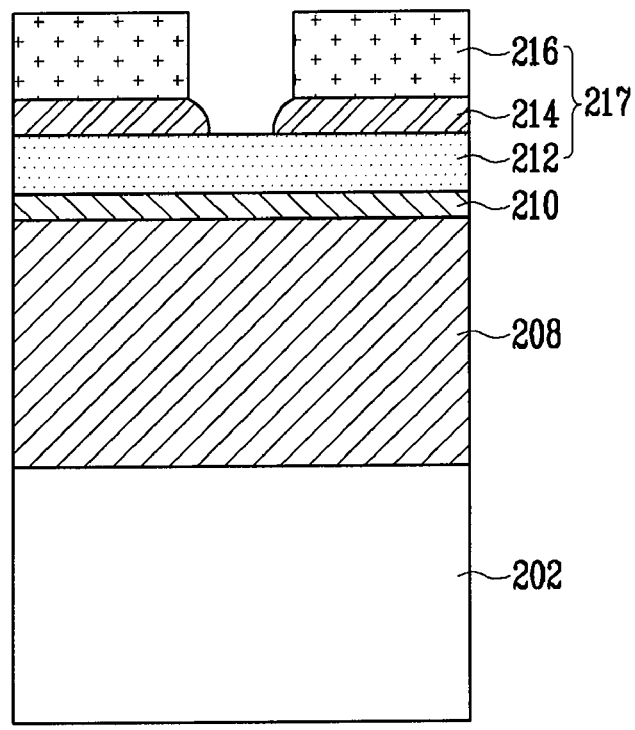

Referring to FIGS. 2C and 3C, in order to pattern the etch mask layer 217 by conducting an etching process for the mask layer 216, the mask layer 216 is first patterned. The mask layer 216 is patterned such that the areas thereof corresponding to the contact holes to be defined in the dielectric layer 210 are open. Portions of the BARC layer 214, which is formed under the mask layer 216, are exposed through the open areas of the mask layer 216.

By conducting an etching process using the patterned mask layer 216, the exposed portions of the BARC layer 214 are removed, and the BARC layer 214 is patterned. When conducting the etching process, the BARC layer 214 is slope-etched such that each of the openings defined in the BARC layer 214 has a sloped profile in which the width of the opening gradually decreases in a downward direction. The slope etching of the BARC layer 214 may be possible due to the fact that a polymer that is a byproduct of the etching process remains in the peripheries of the respective openings defined in the patterned BARC layer 214. As a consequence, each opening of the BARC layer 214 is defined such that the width of the lower end thereof is less than the width of the upper end thereof which corresponds to the width of each opening defined in the mask layer 216. As the BARC layer 214 is patterned, portions of the passivation layer 212, which is formed under the BARC layer 214, are exposed.

In order to conduct the slope etching more easily, it is preferred that high power is applied in the etching process to increase the amount of polymer produced during the etching process and the etching process is conducted at a relatively low temperature to allow the polymer to be not easily removed and remain in the peripheries of the openings. For this purpose, in order to remove the portions of the BARC layer 214, an inductively coupled plasma (ICP) etching process can be conducted with relatively high power including a transformer coupled plasma (TCP) power of 300 W to 1,000 W and a bias power of 200 W to 400 W at a relatively low temperature of 30° C. to 50° C. using HBr gas as an etchant gas.

Figure 2D:
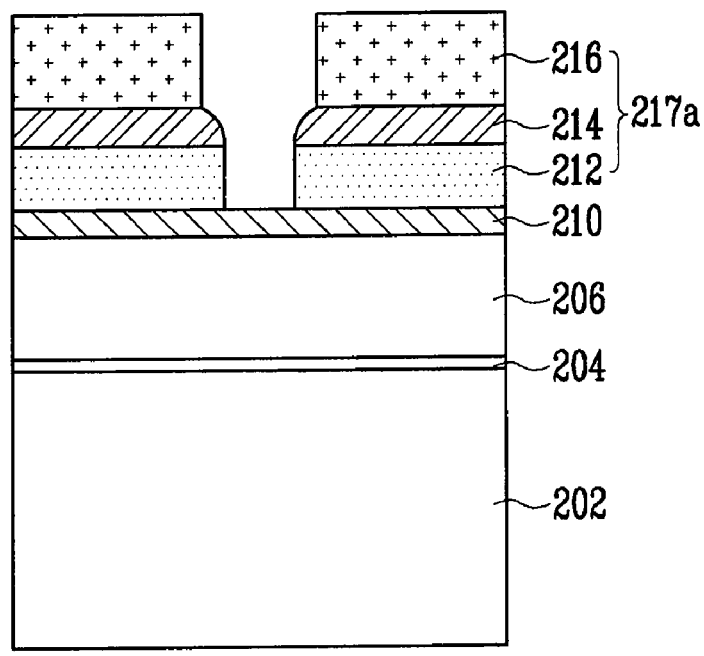
Figure 3D:
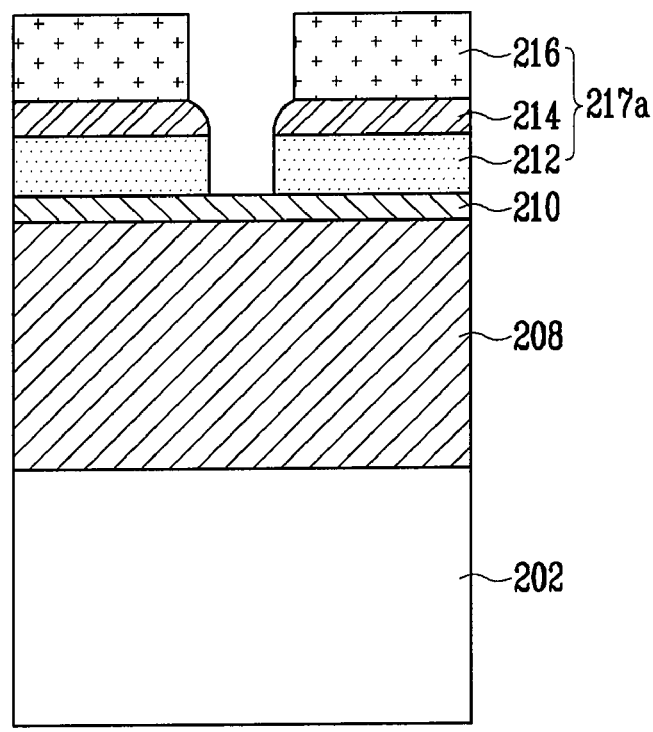

Referring to FIGS. 2D and 3D, by conducting an etching process using the respective patterned mask layer 216 and BARC layer 214 as a mask layer, the exposed portions of the passivation layer 212 are removed, and the passivation layer 212 is patterned. Because each opening of the BARC layer 214 is defined such that the width of the lower end thereof is less than the width of the upper end thereof, openings are defined in the patterned passivation layer 212 such that the width thereof is less than the width of the openings defined in the patterned mask layer 216. Therefore, an etch mask pattern 217a according to the present invention is formed such that the width of the lower end of each opening defined therein is less than the width of the upper end of each opening defined therein.

Due to the fact that the portions of the passivation layer 212 are removed, portions of the dielectric layer 210, which is formed under the passivation layer 212, are exposed. In order to ensure that the dielectric layer 210 formed under the passivation layer 212 is prevented from being damaged, it is preferred that the etching process for removing the portions of the passivation layer 212 be conducted with an etching selectivity ratio of 10:1 to 100:1 with respect to the dielectric layer 210. For this purpose, an ICP etching process can be conducted with a TCP power of 300 W to 1,000 W and a bias power of 200 W to 400 W at a temperature of 30° C. to 50° C. using HBr gas and $O_2$ gas as an etchant gas.

Figure 2E:
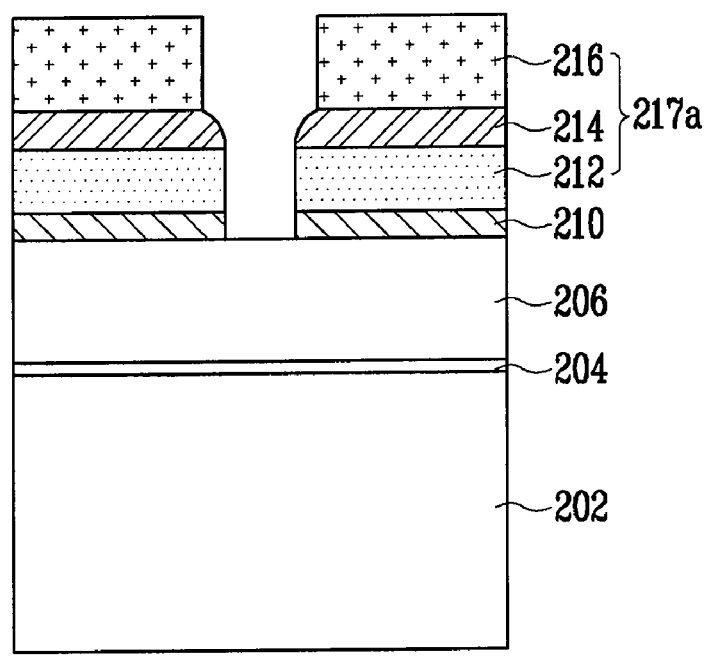
Figure 3E:
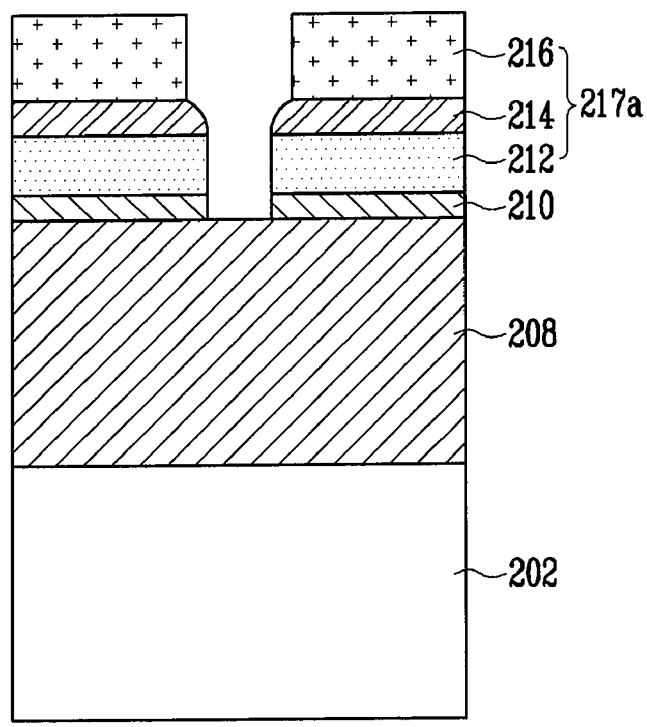

Referring to FIGS. 2E and 3E, by conducting an etching process using the etch mask pattern 217a, the portions of the dielectric layer 210, which are exposed due to the aforementioned process, are removed, and contact holes are defined. In order to prevent the conductive layer 206 for gates, which is formed under the dielectric layer 210, from being damaged while removing the portions of the dielectric layer 210, it is preferred that the etching process for removing the portions of the dielectric layer 210 be conducted with a high etching selectivity with respect to the conductive layer 206 for gates. For this purpose, an ICP etching process can be conducted using $CF_4$ gas as an etchant gas. Since the etch mask pattern 217a is formed such that the width of the lower end of each opening defined therein is less than the width of the upper end of each opening defined therein, openings are defined in the patterned dielectric layer 210 such that the width thereof is less than the width of the openings defined in the mask layer 216 as the width of the upper ends of the openings of the etch mask pattern 217a. Due to the fact that the portions of the dielectric layer 210 are removed, portions of the conductive layer 206 for gates, which is formed under the dielectric layer 210, are exposed, and simultaneously, portions of the isolation layer 208 can be exposed.

Figure 2F:
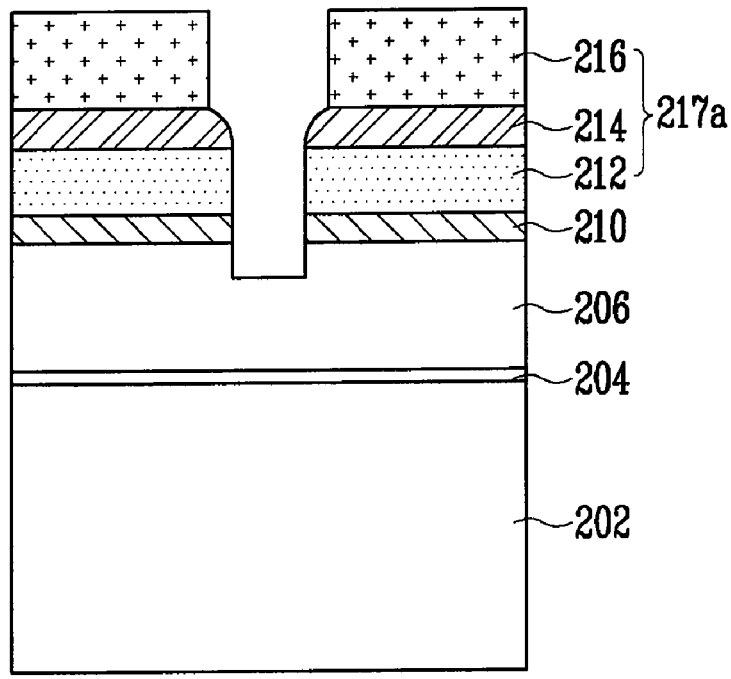
Figure 3F:
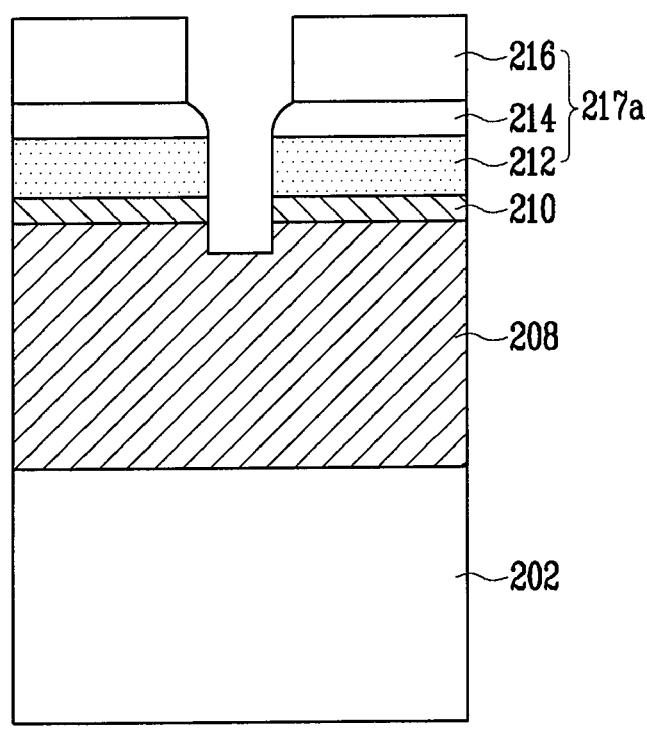

Referring to FIGS. 2F and 3F, by conducting an etching process using the etch mask pattern 217a and the patterned dielectric layer 210 as a mask, the exposed portions of the conductive layer 206 for gates are removed by a partial thickness. When removing the partial thickness of the exposed portions of the conductive layer 206 for gates, the exposed portions of the conductive layer 206 for gates may not be completely removed to allow the semiconductor substrate 202 formed under the conductive layer 206 for gates to not be exposed. For this purpose, an ICP etching process can be conducted with a TCP power of 300 W to 1,000 W and relatively a low bias power of 100 W to 300 W at a temperature of 30° C. to 50° C. using $CHF_3$ gas as an etchant gas. When removing the partial thickness of the exposed portions of the conductive layer 206 for gates, the exposed portions of the isolation layer 208 can be removed by a partial thickness.

Figure 2G:
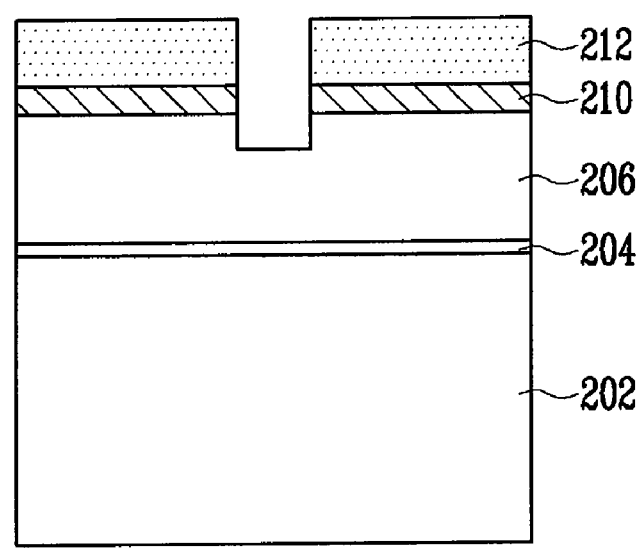
Figure 3G:
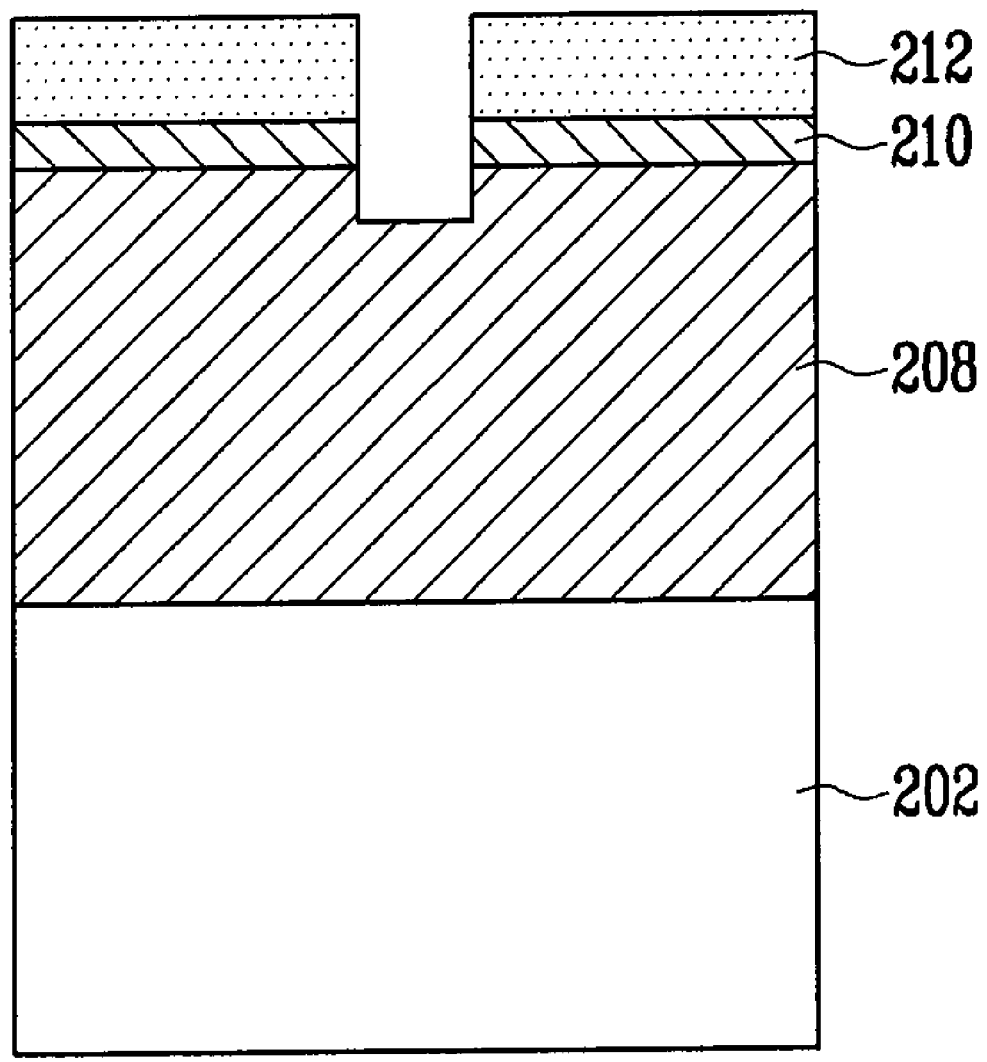

Referring to FIGS. 2G and 3G, the mask layer 216 and the BARC layer 214 are removed.

Thereafter, while not shown in the drawings, by forming a conductive layer for control gates on the passivation layer 212, floating gates and control gates can be electrically connected with each other in a select line through the contact holes defined in the dielectric layer 210.

As described in the above embodiment, the slope etching is conducted only for the BARC layer 214 of the etch mask pattern 217a formed on the dielectric layer 210 such that each of the openings defined in the BARC layer 214 has a sloped profile in which the width of the opening gradually decreases in a downward direction. However, as a matter of course, besides the BARC layer 214, the slope etching can be conducted for an optional layer included in the etch mask pattern 217a such that the width of the lower end of each opening defined in the etch mask pattern 217a is less than the width of the upper end thereof. Specifically, when forming the etch mask pattern 217a, if the slope etching is conducted for at least two layers, it is possible to define openings to have a further decreased width at the lower ends thereof in comparison with the present embodiment of the present invention.

As is apparent from the above description, the method for manufacturing a nonvolatile memory device according to the present invention confers advantages in that, since contact holes can be defined in a dielectric layer to have a finer size than the upper end of the opening defined in an etch mask pattern, it is possible to secure a process margin when overlaying a select line on the dielectric layer. Also, when defining the contact holes in the dielectric layer, an etching process is conducted with the dielectric layer having a high etching selectivity so that a semiconductor substrate is not exposed, whereby it is possible to prevent the connection of control gates and the semiconductor substrate. As a result, in the manufacture of a nonvolatile memory device, the manufacturing yield can be increased and costs can be reduced.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a nonvolatile memory device, the method comprising:
   forming a tunnel insulation layer over a semiconductor substrate including isolation regions and active regions;
   forming a conductive layer for gates over the tunnel insulation layer;
   forming a dielectric layer over the conductive layer for gates;
   forming an etch mask pattern over the dielectric layer such that a width of a lower end of each opening defined in the etch mask pattern is less than a width of an upper end thereof; and
   defining contact holes by removing portions of the dielectric layer using the etch mask pattern,
   wherein forming the etch mask pattern comprises forming a passivation layer over the dielectric layer, forming a BARC (bottom anti-reflection coating) layer over the passivation layer, forming a mask pattern over the BARC layer, slope-etching the BARC layer using the mask pattern, thereby patterning the BARC layer, and patterning the passivation layer using the patterned BARC layer.

2. The method according to claim 1, wherein the slope-etching is conducted such that a byproduct produced while etching the BARC layer remains in peripheries of respective openings defined in the patterned BARC layer.

3. The method according to claim 1, wherein the slope-etching is conducted as inductively coupled plasma (ICP) etching.

4. The method according to claim 1, wherein the slope-etching uses HBr gas as an etchant gas.

5. The method according to claim 1, wherein the slope-etching is conducted with a transformer coupled plasma (TCP) power of 300 W to 1,000 W and a bias power of 200 W to 400 W at a temperature of 30° C. to 50° C.

6. The method according to claim 1, wherein the contact holes in the dielectric layer are defined through an ICP etching process.

7. The method according to claim 1, wherein the contact holes in the dielectric layer are defined using $CF_4$ gas as an etchant gas.

8. The method according to claim 1, wherein, after defining the contact holes in the dielectric layer, the method further comprises:
   removing exposed portions of the conductive layer for gates by a partial thickness.

9. The method according to claim 8, wherein the exposed portions of the conductive layer for gates are removed through an ICP etching process.

10. The method according to claim 8, wherein the exposed portions of the conductive layer for gates are removed using $CHF_3$ gas.

11. The method according to claim 8, wherein the exposed portions of the conductive layer for gates are removed with a TCP power of 300 W to 1,000 W and a bias power of 100 W to 300 W at a temperature of 30° C. to 50° C.

12. The method according to claim 1, wherein patterning the passivation layer is implemented through an etching process having an etching selectivity ratio of 10:1 to 100:1 with respect to the dielectric layer.

13. The method according to claim 1, wherein patterning the passivation layer is implemented through an ICP etching process.

14. The method according to claim 1, wherein patterning the passivation layer is implemented using HBr gas and $O_2$ gas.

15. The method according to claim 1, wherein patterning the passivation layer is implemented with a TCP power of 300 W to 1,000 W and a bias power of 200 W to 400 W at a temperature of 30° C. to 50° C.

* * * * *